(12) United States Patent
Wong et al.

(10) Patent No.: US 8,919,631 B2
(45) Date of Patent: Dec. 30, 2014

(54) WIRE BONDER INCLUDING A TRANSDUCER, A BOND HEAD, AND A MOUNTING APPARATUS

(75) Inventors: Yam Mo Wong, Singapore (SG); Ka Shing Kwan, Singapore (SG); Hing Leung Li, Yuen Long (HK); Xiang Chao Li, Singapore (SG)

(73) Assignee: ASM Technology Singapore Pte Ltd, Singapore (SG)

( * ) Notice: Subject to any disclaimer, the term of this patent is extended or adjusted under 35 U.S.C. 154(b) by 233 days.

(21) Appl. No.: 13/420,739

(22) Filed: Mar. 15, 2012

(65) Prior Publication Data

US 2013/0240605 A1    Sep. 19, 2013

(51) Int. Cl.
*B23K 20/00* (2006.01)
*B23K 20/10* (2006.01)
*H01L 23/00* (2006.01)
*B06B 3/00* (2006.01)

(52) U.S. Cl.
CPC .............. *B23K 20/007* (2013.01); *H01L 24/85* (2013.01); *B23K 20/004* (2013.01); *B23K 20/103* (2013.01); *B23K 20/10* (2013.01); *B23K 20/002* (2013.01); *B06B 3/00* (2013.01); *B23K 20/005* (2013.01); *B23K 20/106* (2013.01); *H01L 24/80* (2013.01)
USPC .......................... 228/1.1; 228/110.1; 228/111

(58) Field of Classification Search
CPC .. B23K 20/002; B23K 20/004; B23K 20/005; B23K 20/007; B23K 20/10; B23K 20/103; B23K 20/106; H01L 24/80; H01L 24/85; B06B 3/00
USPC ........................................ 228/1.1, 110.1, 111
See application file for complete search history.

(56) References Cited

U.S. PATENT DOCUMENTS 6,439,448 B1 *   8/2002   Ringler .................. 228/110.1
7,137,543 B2 * 11/2006   DeAngelis et al. ............ 228/1.1

* cited by examiner

*Primary Examiner* — Erin Saad
(74) *Attorney, Agent, or Firm* — Ostrolenk Faber LLP

(57) ABSTRACT

Disclosed is an apparatus for mounting a transducer to a bond head of a wire bonder. In particular, the bond head of the wire bonder is operative to mechanically drive the transducer when forming electrical interconnections between separate locations within a semiconductor package. Specifically, the apparatus comprises: i) a flexural structure having a connector for connecting to the transducer, the flexural structure being configured to bend; and ii) at least one actuator attached to the flexural structure, the at least one actuator being operative to bend the flexural structure to thereby cause a displacement of the transducer connected thereto via the connector.

17 Claims, 8 Drawing Sheets

WIRE BONDER INCLUDING A TRANSDUCER, A BOND HEAD, AND A MOUNTING APPARATUS

FIELD OF THE INVENTION

This invention relates to an apparatus for mounting a transducer to a bond head of a wire bonder. In particular, the wire bonder is operative to mechanically drive the transducer when forming electrical interconnections between separate locations within a semiconductor package.

BACKGROUND OF THE INVENTION

Wire bonders are used in semiconductor packaging to form electrical interconnections between separate locations within a semiconductor package. A wire bonder will comprise a bonding device for forming the electrical interconnections within the semiconductor package. Typically, the bonding device includes a transducer for providing bonding energy and a bonding tool through which a bonding wire is introduced to form the electrical interconnections within the semiconductor package.

For example, an ultrasonic transducer of a wire bonder is mechanically driven to move the bonding tool tip in a scrubbing motion during ball bonding to clean a die pad surface of a semiconductor die. The ultrasonic transducer also provides ultrasonic bonding energy during ball bonding to cause adhesion of a ball bond of the bonding wire with the die pad surface. Good adhesion of the ball bond with the die pad surface accordingly reduces the likelihood of the ball bond being detached from the die pad surface when the wire is pulled by the wire bonder from the die pad towards the leadframe to form an electrical interconnection within the semiconductor package.

As the ultrasonic transducer is linearly driven along its longitudinal axis, the scrubbing motion of the bonding tool tip will also be linear with respect to the longitudinal axis of the ultrasonic transducer. Such a linear scrubbing motion of the bonding tool tip may not sufficiently clean the die pad surface, thereby affecting the quality of the ball bonding process. Moreover, as the ultrasonic transducer generally provides bonding energy at a fixed ultrasonic frequency range, this may also compromise the bond strength between the ball bond and the die pad surface of the semiconductor die.

Thus, it is an object of the present invention to seek to address any of these limitations of conventional wire bonders.

SUMMARY OF THE INVENTION

An aspect of the invention is an apparatus for mounting a transducer to a bond head of a wire bonder. In particular, the bond head of the wire bonder is operative to mechanically drive the transducer when forming electrical interconnections between separate locations within a semiconductor package. Specifically, the apparatus comprises: i) a flexural structure having a connector for connecting to the transducer, the flexural structure being configured to bend; and ii) at least one actuator attached to the flexural structure, wherein the at least one actuator is operative to bend the flexural structure to thereby cause a displacement of the transducer connected thereto via the connector.

Advantageously, such an apparatus provides an additional means of mechanically driving the transducer when forming the electrical interconnections between separate locations within the semiconductor package. For example, the at least one actuator may be operative to bend the flexural structure, such that the transducer is displaced along a path that is different from a longitudinal axis of the transducer along which the transducer is operative to oscillate when it is mechanically driven by the bond head of the wire bonder. Thus, the apparatus may allow a scrubbing motion of a capillary tip to clean a die pad surface of a semiconductor die. (The capillary is a bonding tool through which a bonding wire is introduced to form the electrical interconnections within the semiconductor package.) By providing a multi-linear scrubbing motion of the capillary tip, the apparatus may better ensure that the die pad surface of the semiconductor die is sufficiently cleaned, so that the quality of the ball bonding process can be advantageously improved.

Further, the at least one actuator may be a piezo-stack actuator that is configured to be actuated by an electrical source oscillating at a sub-ultrasonic frequency. By performing ball bonding at various frequencies and along various linear axes, the bonding energy provided by the wire bonder can proceed along various linear axes during ball bonding to cause adhesion of the ball bond with the die pad surface of the semiconductor die.

Advantageously, the apparatus may better ensure that the bond strength between the ball bond and the die pad surface with the semiconductor package is sufficiently strong.

Some other optional features of the apparatus have also been defined herein.

BRIEF DESCRIPTION OF THE DRAWINGS

Embodiments of the invention will now be described, by way of example only, with reference to the accompanying drawings of which.

DETAILED DESCRIPTION OF THE EMBODIMENTS

Figure 1:
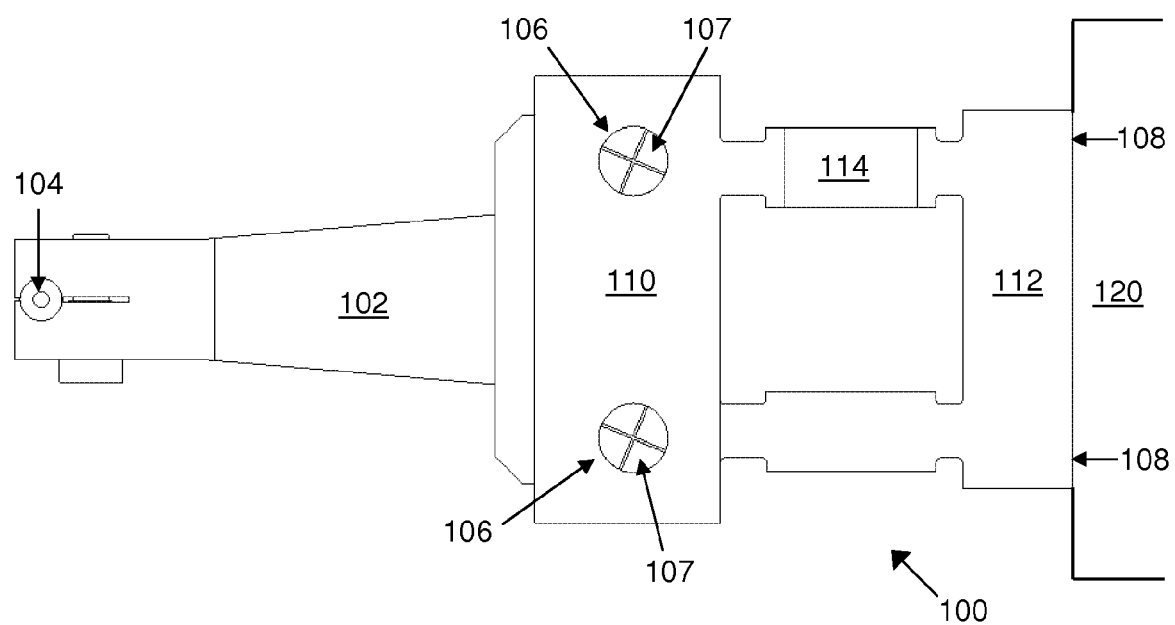
FIG. 1 is a top view of an apparatus for mounting a bonding device to a bond head of a wire bonder according to a first embodiment of the invention, wherein the apparatus comprises a piezo-stack actuator.

FIG. 1 is a top view of a mounting device 100 according to a first embodiment of the present invention for mounting a bonding device to a bond head 120 of a wire bonder. The bonding device comprises a transducer (shown as an ultrasonic transducer 102) and a bonding tool (shown as a capillary 104 through which a bonding wire is introduced) operatively connected to the ultrasonic transducer 102. In particular, the wire bonder is operative to mechanically drive the ultrasonic transducer 102 when forming electrical interconnections between separate locations within a semiconductor package.

The ultrasonic transducer 102 has an elongate body portion extending along a longitudinal Y-axis, and is mechanically driven by electrical energy to move a tip of the capillary 104 in a scrubbing motion along the same longitudinal Y-axis during ball bonding to clean a die pad surface of a semiconductor die. The ultrasonic transducer 102 also provides bonding energy by vibrating along the longitudinal Y-axis at an ultrasonic frequency during ball bonding to cause adhesion of a ball bond of the bonding wire with the die pad surface. Displacement of the ultrasonic transducer 102 along its longitudinal Y-axis is typically between 1-2 microns when the ultrasonic transducer 102 is driven at the ultrasonic frequency to provide the scrubbing motion and bonding energy. After the ball bonding process is completed, the bonding wire is then pulled by the capillary 104 from the die pad of the semiconductor die towards the leadframe to form an electrical interconnection within the semiconductor package.

The mounting device 100 comprises a plurality of connectors for connecting to the bonding device and to the bond head 120 of the wire bonder 120. Specifically, FIG. 1 shows the mounting device 100 having screw openings 106 through which screws 107 are introduced to mate with corresponding screw openings of the ultrasonic transducer 102 to connect the ultrasonic transducer 102 (and thereby the capillary 104) to the mounting device 100. Similarly, the mounting device 100 also has screw openings 108 (hidden from the top view of FIG. 1) at its side for mating with screws of the bond head 120 to connect the mounting device 100 to the bond head 120. Although the mounting device 100 shown in FIG. 1 includes two screw openings 106, 108 for connecting to each of the ultrasonic transducer 102 and the bond head 120, it should be appreciated that the mounting device 100 may also include a single screw opening for connecting to each of the ultrasonic transducer 102 and the bond head 120. It should also be appreciated that other types of connectors besides the screw openings 106, 108 may also be used, so long as they are capable of connecting the mounting device 100 to each of the ultrasonic transducer 102 and the bond head 120.

Further, the mounting device 100 includes a flexural member 110 that is configured to bend. In particular, the screw openings 106 of the mounting device 100 for attaching to the bonding device (and, in particular, the ultrasonic transducer 102) are features of the flexural member 110. A suitable material for fabricating the flexural member 110 to realize the bending capability may be titanium. The mounting device 100 also includes a base member 112 with a degree of rigidity higher than that of the flexural member 110. In particular, the mounting device 100 is connected to the bond head 120 of the wire bonder via the screws fitted through the screw openings 108 at the base member 112 and through screw openings at the bond head 120. A suitable material for fabricating the base member 112 having a degree of rigidity higher than that of titanium may be aluminum.

In addition, the mounting device 100 includes an actuator (shown as a piezo-stack actuator 114) attached between the flexural member 110 and the base member 112. In particular, the piezo-stack actuator 114 is deformable (i.e. actuable) via expansion and contraction in a linear motion along its longitudinal Y-axis by an electrical source oscillating at a given frequency. Since the piezo-stack actuator 114 is attached to the flexural member 110 which is thereby attached to the ultrasonic transducer 102, deformation of the piezo-stack actuator 114 thereby causes a corresponding displacement of the capillary 104 during wire bonding. In particular, the piezo-stack actuator 114 is positioned at a side of the mounting device 100, as can be seen in FIG. 1. Thus, linear deformation of the piezo-stack actuator 114 along its longitudinal Y-axis will accordingly displace the tip of the capillary 104 generally along an X-axis that is perpendicular to the longitudinal Y-axis of the ultrasonic transducer 102 along which the ultrasonic transducer 102 oscillates when mechanically driven by the bond head 120 of the wire bonder.

Moreover, displacement of the tip of the capillary 104 as caused by the deformation of the piezo-stack actuator 114 via expansion and contraction is usually relatively large. There are two reasons to explain this: firstly, any linear deformation of the piezo-stack actuator 114 along its longitudinal axis is amplified by the arrangement of the length of the flexural member 110 and the ultrasonic transducer 102; secondly, the frequency of the electrical energy that mechanically drives the piezo-stack actuator 114 is below the ultrasonic range—for example, 1 KHz—to provide large displacements of the piezo-stack actuator 114 via expansion and contraction of about 20 microns. In contrast, conventional transducers such as the ultrasonic transducer 102—typically include piezo-disks that are mechanically driven by electrical energy at an ultrasonic frequency (i.e. frequencies more than 20 KHz) to provide small deformations of the piezo-disks of only about 1-2 microns via expansion and contraction.

Figure 2A:
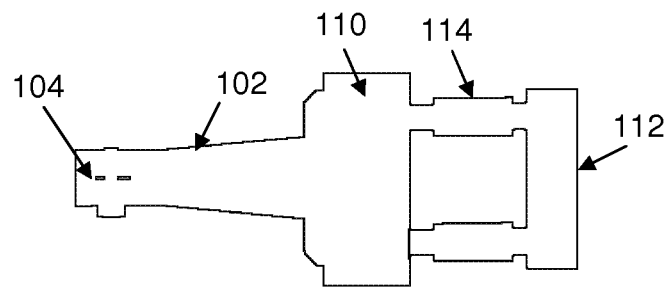
FIGS. 2a-2c show the operation of the apparatus of FIG. 1.
Figure 2B:
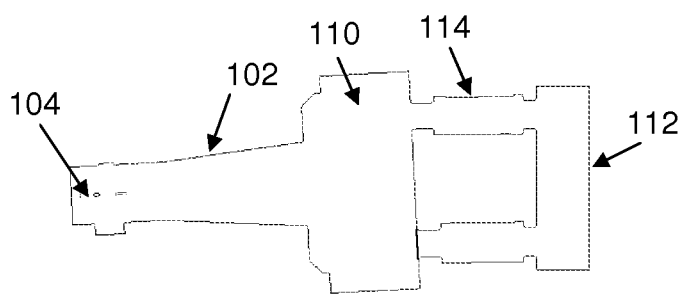
Figure 2C:
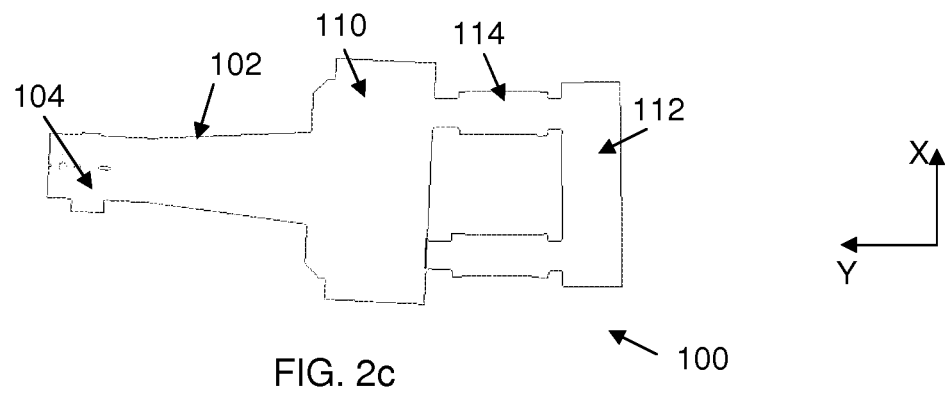

FIGS. 2a-2c are top views of the mounting device 100, showing how the capillary 104 can be displaced by the deformation of the piezo-stack actuator 114 during wire bonding.

Specifically, FIG. 2a shows an original position of the capillary 104 before the piezo-stack actuator 114 is deformed by electrical energy at a sub-ultrasonic frequency. As the electrical voltage applied across the piezo-stack actuator 114 increases, the extent of linear deformation of the piezo-stack actuator 114 via expansion along its longitudinal Y-axis also increases. The expanded piezo-stack actuator 114 accordingly pushes against the flexural member 110, and thereby displaces the capillary 104 downwards in a linear motion along the X-axis, as shown in FIG. 2b. Decrease in the voltage applied across the piezo-stack actuator 114 due to oscillation of the electrical energy applied across the piezo-stack actuator 114 will cause the piezo-stack actuator 114 to be deformed via contraction along the Y-axis. The contracted piezo-stack actuator 114 thus pulls the flexural member 110, and thereby displaces the capillary 104 upwards in a linear motion along the X-axis, as shown in FIG. 2c.

Thus, the mounting device 100 allows the scrubbing motion of the tip of the capillary 104 during wire bonding to be performed in multiple directions either along the longitudinal Y-axis of the ultrasonic transducer 102, or along the X-axis perpendicular to the longitudinal Y-axis of the ultrasonic transducer 102. This is opposed to conventional wire bonders, in which the capillary tip can only perform the scrubbing motion in a single linear motion along the longitudinal Y-axis of the transducer. By providing a multi-linear scrubbing motion of the capillary tip, the wire bonder 120 may thus ensure that the die pad surface of the semiconductor die is sufficiently cleaned, so that the quality of the ball bonding process is advantageously improved.

Besides ensuring that the die pad surface of the semiconductor die is sufficiently cleaned by the multi-linear scrubbing motion of the capillary tip, the wire bonder may also provide bonding energy at a frequency different from the ultrasonic frequency of the ultrasonic transducer 102. Thus, the bonding energy provided by the wire bonder can proceed along various linear axes during ball bonding to cause adhesion of the ball bond of the bonding wire with the die pad surface of the semiconductor die. In contrast, conventional wire bonders generally provide bonding energy at a fixed ultrasonic frequency and in a single linear motion. By performing ball bonding at various frequencies and along various linear axes, the wire bonder may advantageously ensure that the bond strength between the ball bond and the die pad surface with the semiconductor package is higher.

Figure 3:
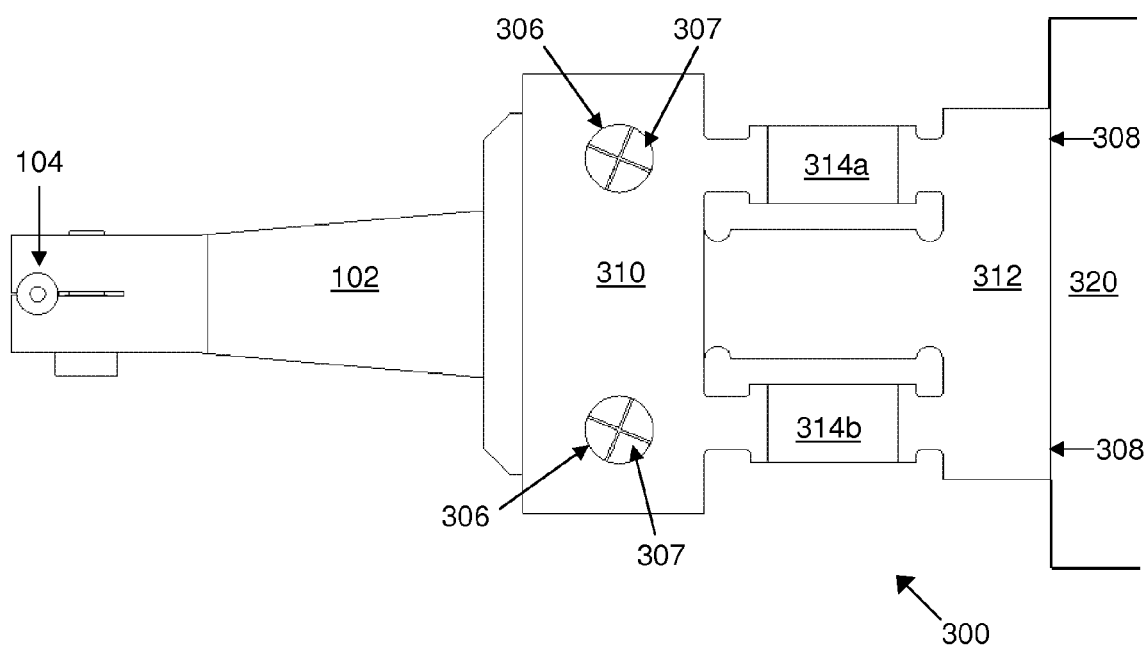
FIG. 3 is a top view of an apparatus for mounting a bonding device to a bond head of a wire bonder according to a second embodiment of the invention, wherein the apparatus comprises two piezo-stack actuators.

FIG. 3 is a top view of a mounting device 300 according to a second embodiment of the present invention for mounting a bonding device to a bond head 320 of a wire bonder. Specifically, both the ultrasonic transducer 102 and the capillary 104 can be mounted to the mounting device 300 via screws 307 connected between the screw openings 306 of the mounting device 300 and the screw openings of the ultrasonic transducer 102. Similarly, the mounting device 300 also has screw openings 308 (hidden from the top view of FIG. 3) at its side for mating with screws of the bond head 320 to connect the mounting device 100 to the wire bonder.

Also, the mounting device 300 includes a flexural member 310 that is configured to bend. The screw openings 306 of the mounting device 300 for attaching to the ultrasonic transducer 102 are features of the flexural member 310. The mounting device 300 also includes a base member 312 with a degree of rigidity higher than that of flexural member 310. In particular, the base member 312 of the mounting device 300 is connected to the wire bonder via screws fitted through the screw openings 308 at the base member 312 and through screw openings at the bond head 320.

However, in contrast to the mounting device 100 of the first embodiment, the mounting device 300 of the second embodiment comprises two actuators (shown as a piezo-stack actuators 314a, 314b) attached to the flexural member 310. In particular, the piezo-stack actuators 314a, 314b are also deformable via expansion and contraction in a linear motion along their respective longitudinal Y-axes by an electrical source oscillating at a given frequency. Since the piezo-stack actuators 314a, 314b are attached to the flexural member 310 which is thereby attached to the ultrasonic transducer 102, deformation of the piezo-stack actuators 314a, 314b therefore causes a corresponding displacement of the capillary 104 during wire bonding. In particular, the piezo-stack actuators 314a, 314b are positioned at opposite sides of the mounting device 100 as can be seen in FIG. 3. Thus, linear deformation of the piezo-stack actuators 314a, 314b along their respective longitudinal Y-axes during ball bonding will result in displacement of the tip of the capillary 104 along an X-axis that is perpendicular to the longitudinal Y-axis.

It should be appreciated that the piezo-stack actuators 314a, 314b of the mounting device 300 work similarly to the piezo-stack actuator 114 of the mounting device 100. For instance, the piezo-stack actuators 314a, 314b are configured to be mechanically driven by an electrical source oscillating at a frequency lower than the ultrasonic range—for example 1 KHz—to provide large deformation of about 20 microns. However, to ensure that linear deformation of the piezo-stack actuators 314a, 314b along their respective longitudinal Y-axes accordingly displaces the capillary 104 along a X-axis that is perpendicular to the Y-axis, respective frequencies of the oscillating electrical sources that drive the piezo-stack actuators 314a, 314b have to be mutually out of phase (e.g. by 180 degrees). In this way, one of the piezo-actuators 314a deforms by expansion while the other one of the piezo-actuators 314b deforms by contraction. Otherwise, both the piezo-stack actuators 314a, 314b will mutually move in phase in a linear motion along their respective longitudinal Y-axes.

FIGS. 4a-4e are top views of the apparatus of FIG. 3, showing an operation of the two piezo actuators.

Figure 4A:
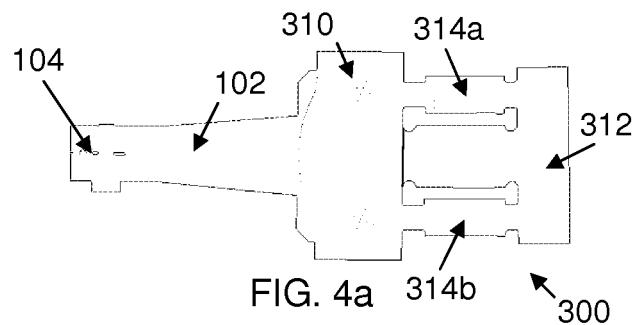
FIGS. 4a-4e show the operation of the apparatus of FIG. 3.
Figure 4B:
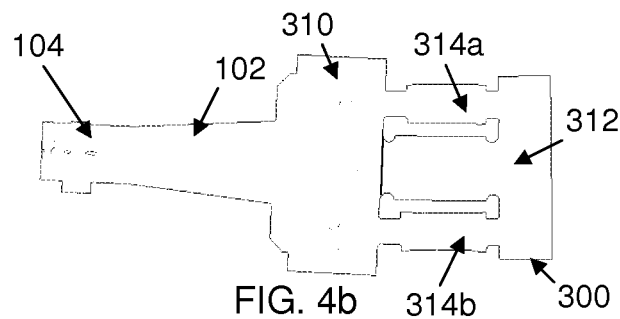
Figure 4C:
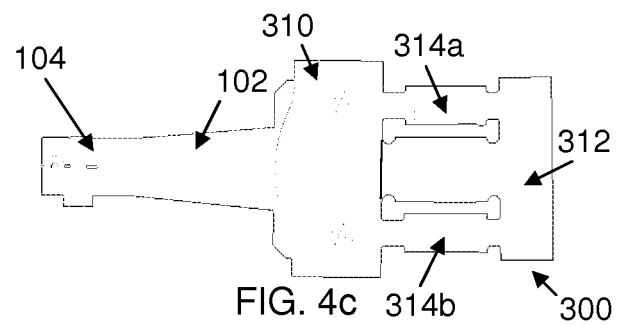
Figure 4D:
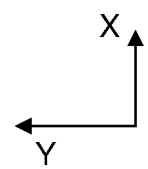
Figure 4D:
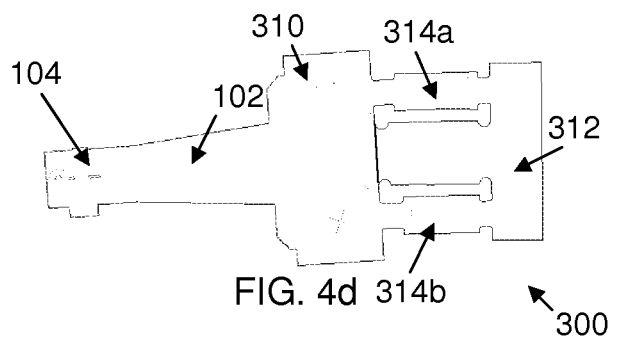
Figure 4E:
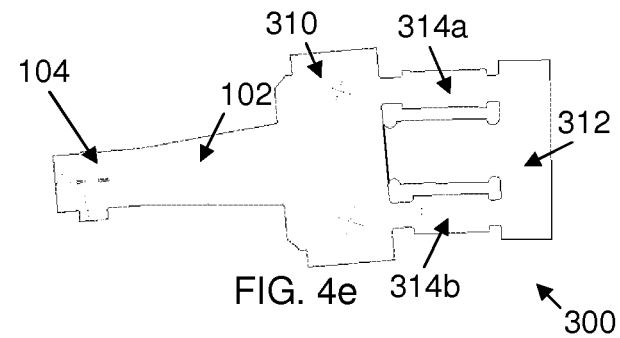

Specifically, FIG. 4a shows an original position of the capillary 104 before the piezo-stack actuators 314a, 314b are deformed by an electrical source oscillating at a sub-ultrasonic frequency. The application of electrical energy that is mutually out of phase across the piezo-stack actuators 314a, 314b would result in the piezo-stack actuators being mutually deformed in linear motions in opposite directions along their longitudinal Y-axes. FIGS. 4b and 4c show respective contraction and expansion of the piezo-stack actuators 314a, 314b to cause corresponding displacements of the capillary 104 in an upward linear motion along the X-axis. The oscillation of the electrical energy applied across the piezo-stack actuators 314a, 314b will result in a reversal of the respective contraction and expansion of the piezo-stack actuators 314a, 314b to produce respective expansion and contraction of the piezo-stack actuators 314a, 314b, thereby causing corresponding displacements of the capillary 104 in a downward linear motion along the X-axis, as shown in FIGS. 4d and 4e.

It should be appreciated that the potential displacement of the capillary 104 along the X-axis as caused by deformation of the piezo-actuators 314a, 314b will be larger than the capillary displacement as caused by the deformation of a single piezo-stack actuator 114 as in the case of the mounting device 100 of the first embodiment. This may provide a number of advantages: firstly, the tip of the capillary 104 may be able to carry out the scrubbing motion over a greater surface area for cleaning the die pad surface; and secondly, the mounting device 300 may also provide ultrasonic bonding energy over a greater surface area for causing diffusion of the ball bond with the die pad surface of the semiconductor die.

Figure 5:
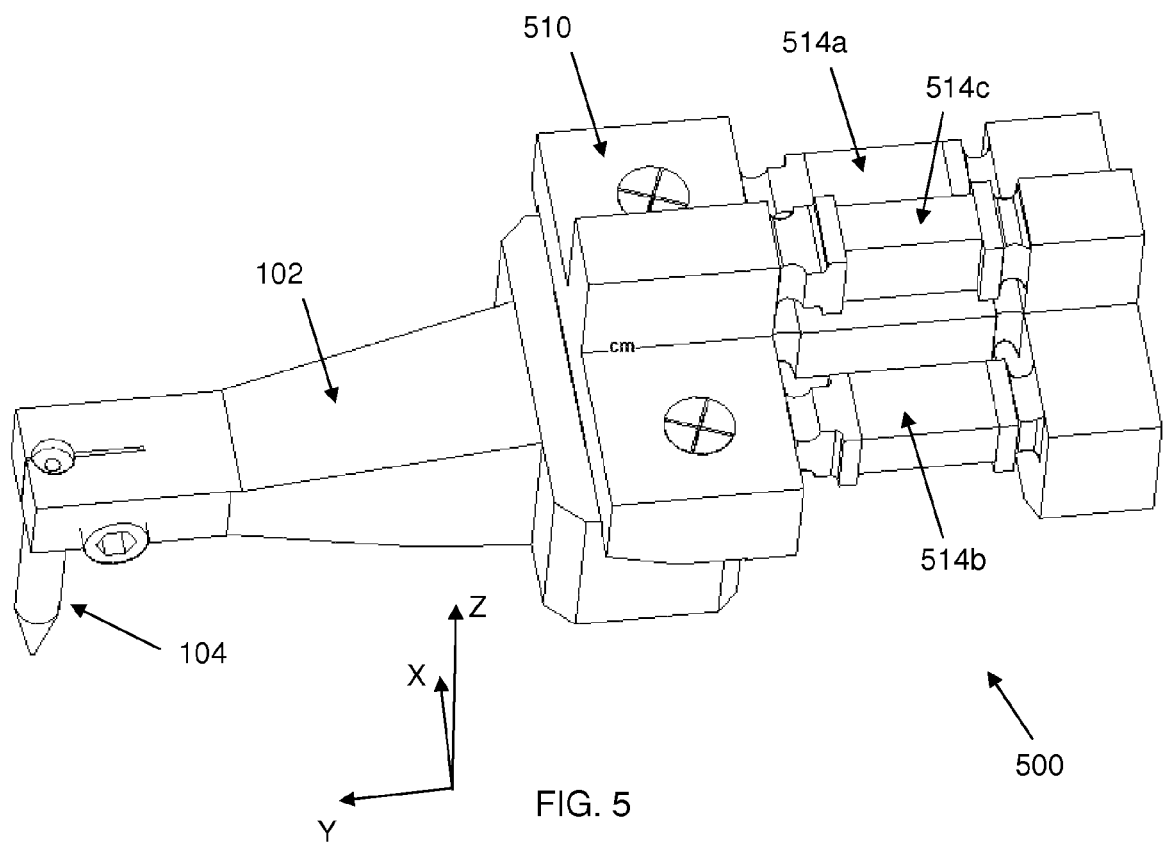
FIG. 5 is a perspective view of an apparatus for mounting a bonding device to a bond head of a wire bonder according to a third embodiment of the invention, wherein the apparatus comprises three piezo-stack actuators.

FIG. 5 is a perspective view of a mounting device 500 according to a third embodiment of the invention for mounting a bonding device to a bond head of a wire bonder. The mounting device 500 of the third embodiment is similar to the mounting devices 100, 300 of the first and second embodiments. For example, compared with the mounting device 300 of the second embodiment, the mounting device 500 of the third embodiment also includes two piezo-stack actuators 514a, 514b along an YX-plane which are connected to a flexural member 510.

However, unlike the mounting device 300 of the second embodiment, the mounting device 500 of the third embodiment further includes an additional piezo-stack actuator 514c arranged above and between the two piezo-stack actuators 514a, 514b. Specifically, the additional piezo-stack actuator 514c is arranged outside of the YX-plane on which the other two piezo-stack actuators 514a, 514b are arranged. This additional piezo-stack actuator 514c is also connected to the flexural member 504. Thus, through an application of various electrical sources oscillating at given frequencies (e.g. 1 KHz), deformations of the two piezo-stack actuators 514a, 514b that are in phase with each other together with deformation of the additional piezo-stack actuator 514c that is out of phase with respect to the deformations of the two piezo-stack actuators 514a, 514b via expansion and contraction in a linear motion along the Y-axis will cause a displacement of the tip of the capillary 104 generally along its longitudinal Z-axis, which is orthogonal to both the Y and X axes. For example, the additional piezo-stack actuator 514c may be configured to be actuated in linear motion in opposite directions to the other two piezo-stack actuators 514a, 514b. The Z-axis displacement of the capillary tip may be useful when bonding the ball bond of the bonding wire to the die pad surface of the semiconductor die.

Figure 6:
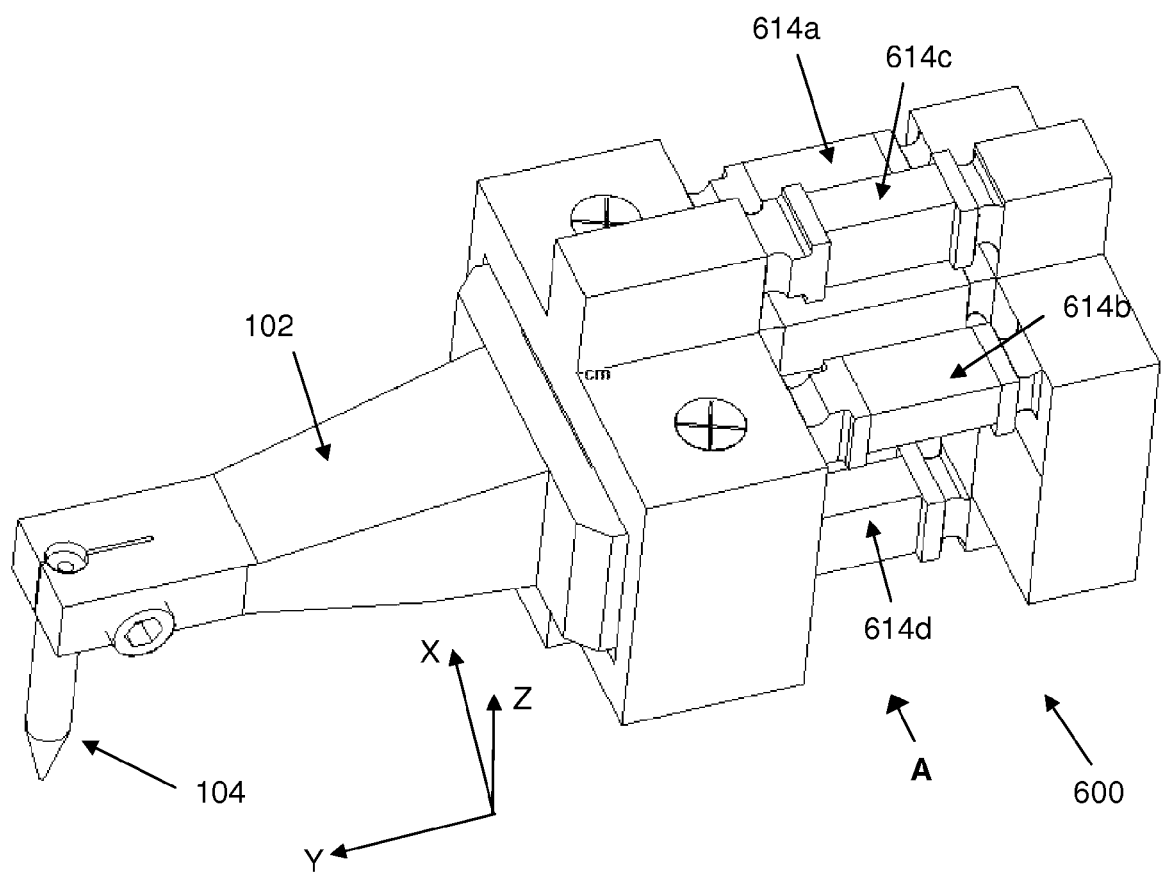
FIG. 6 is a perspective view of an apparatus for mounting a bonding device to a bond head of a wire bonder according to a fourth embodiment of the invention, wherein the apparatus comprises four piezo-stack actuators.

FIG. 6 is a perspective view of a mounting device 600 according to a fourth embodiment of the invention for mounting a bonding device to a bond head (shown in FIG. 7 as 620) of a wire bonder. The mounting device 600 of the fourth embodiment is similar to the mounting device 500 of the third embodiment, except in respect of an additional piezo-stack actuator 614d arranged below the two piezo-stack actuators 614a, 614b and parallel to the piezo-stack actuator 614c on a ZY-plane. In particular, the ZY-plane is orthogonal to the XY-plane along which two other piezo-stack actuators 614a, 614b are arranged.

As the mounting device 600 of the fourth embodiment is similar to the mounting devices 100, 300, 500 of the previous three embodiments, their principles and operations as earlier described will apply. For instance, it should be appreciated that the potential displacement of the capillary 104 along the Z-axis as caused by deformation of the piezo-actuators 614c, 614d via expansion and contraction will be larger than the capillary displacement as caused by the deformation of just the piezo-stack actuator 514c, as in the case of the mounting device 500 of the third embodiment.

Figure 7:
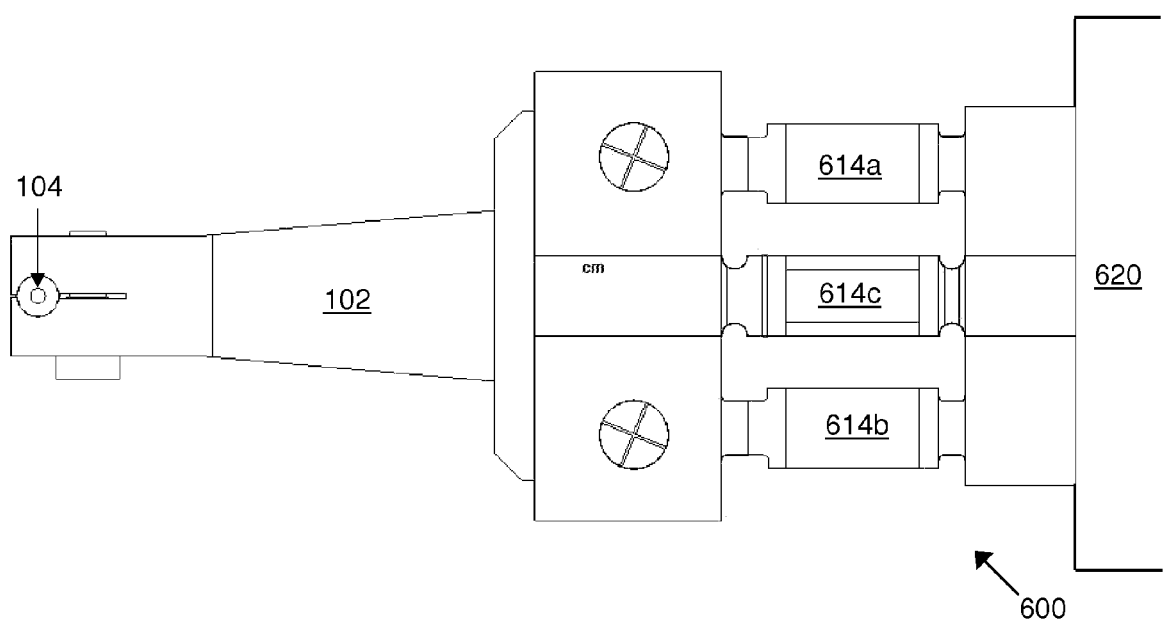
FIG. 7 is a top view of the apparatus of FIG. 6.

FIG. 7 shows a top view of the mounting device 600.

Application of electrical energy that is mutually out of phase across the piezo-stack actuators 614a, 614b would result in respective expansion and contraction of the piezo-stack actuators 614a, 614b, and a corresponding linear motion of the tip of the capillary 104 along the X-axis. Also, oscillation of the phase polarities of the electrical energy applied across the piezo-stack actuators 614a, 614b would cause a reversal of the respective expansion and contraction of the piezo-stack actuators 614a, 614b, and a corresponding linear motion of the tip of the capillary 105 in an opposite direction along the X-axis.

Similarly, application of respective electrical sources that are mutually out of phase across the piezo-stack actuators 614c, 614d would result in respective expansion and contraction of the piezo-stack actuators 614c, 614d, and a corresponding linear motion of the tip of the capillary 104 along the Z-axis. Also, oscillation of the phase polarities of the electrical energy applied across the piezo-stack actuators 614c, 614d would cause a reversal of the respective expansion and contraction of the piezo-stack actuators 614c, 614d, and a corresponding linear motion of the tip of the capillary 105 in an opposite direction along the Z-axis.

FIGS. 8a to 8d are side views of the mounting device 600 when viewed along direction A as shown in FIG. 6.

Figure 8A:
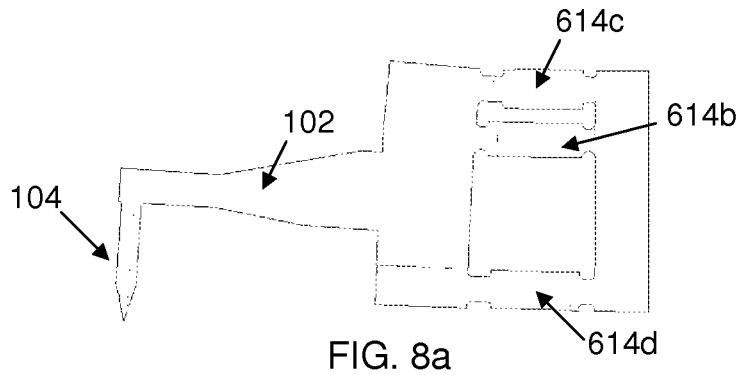
FIGS. 8a-8d show the operation of the apparatus of FIG. 6.
Figure 8B:
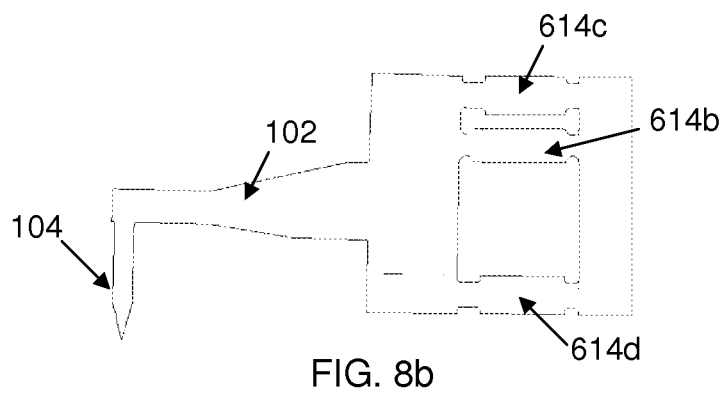
Figure 8C:
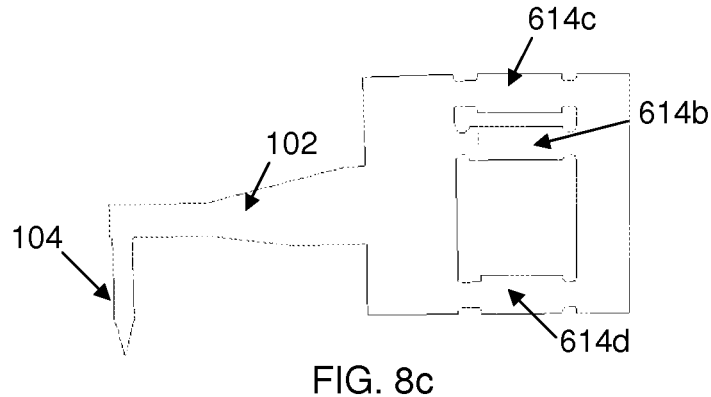
Figure 8D:
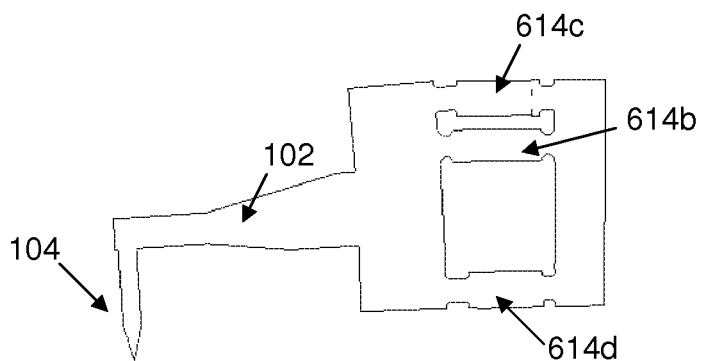

FIGS. 8a and 8b are side views of the mounting device 600, showing upward displacements of the capillary 104 along the Z-axis through the application of electrical energy that is mutually out of phase across the piezo-stack actuators 614c, 614d to cause respective contraction and expansion of the piezo-stack actuators 614c, 614d. When the phase polarities of the electrical energy applied across the piezo-stack actuators 614c, 614d oscillate by 180 degrees, the capillary 104 will be accordingly displaced downwards along the Z-axis due to the respective expansion and contraction of the piezo-stack actuators 614c, 614d, as shown in FIGS. 8c and 8d.

It should be appreciated that other embodiments may also fall within the scope of the invention. For instance, the base member 112 of the mounting device 100 may instead be replaced by the flexural member 110, such that the entire structure of the mounting device 100 is configured to bend. In addition, it is not necessary for the piezo-stack actuator 114 to be arranged at a side of the mounting device 100, as is the case seen in FIG. 1. The piezo-stack actuator 114 may instead be arranged in the middle of the mounting device 100, such that deformation of the piezo-stack actuator 114 along its longitudinal Y-axis displaces the bonding device—which comprises the ultrasonic transducer 102 and the capillary 104—along the same longitudinal Y-axis. Other types of actuators may also be used, such as magnetostrictive actuators actuable by an applied magnetic field and/or sharp memory alloy based actuators, besides the piezo-stack actuators described above. Further, the mounting device as described above may also be an integral built-in feature of the bond head of the wire bonder for connecting to the transducer of the wire bonder.

The invention claimed is:

1. A wire bonder comprising:
an ultrasonic transducer configured to perform wire bonding;
a bond head; and
a mounting apparatus configured to mount the ultrasonic transducer to the bond head, the ultrasonic transducer being configured to be mechanically driven on a horizontal plane to form electrical interconnections between separate locations within a semiconductor package, the mounting apparatus comprising:
a flexural structure that is configured to bend, wherein the ultrasonic transducer is mounted to the flexural structure;
at least one actuator attached to the flexural structure, the at least one actuator being configured and operative to bend the flexural structure, thereby causing a displacement of the ultrasonic transducer on at least the horizontal plane; and
a plurality of connectors configured to connect the mounting apparatus to the ultrasonic transducer,
wherein the at least one actuator is attached to the flexural structure at a first end of the flexural structure and the ultrasonic transducer extends from a second end of the flexural structure, the second end of the flexural structure being on an opposite side of the flexural structure relative to the first end of the flexural structure.

2. A wire bonder comprising:
a transducer;
a bond head; and
a mounting apparatus configured to mount the transducer to the bond head, the transducer being configured to be mechanically driven on a horizontal plane to form electrical interconnections between separate locations within a semiconductor package, the mounting apparatus comprising:
a flexural structure that is configured to bend, wherein the transducer is mounted to the flexural structure;
at least one actuator attached to the flexural structure, the at least one actuator being configured and operative to bend the flexural structure, thereby causing a displacement of the transducer on at least the horizontal plane; and
a plurality of connectors configured to connect the mounting apparatus to the transducer,
each of the at least one actuator being arranged such its longitudinal axis is laterally offset from a longitudinal axis of the transducer.

3. A wire bonder comprising:
a transducer;
a bond head; and
a mounting apparatus configured to mount the transducer to the bond head, the transducer being configured to be mechanically driven on a horizontal plane to form electrical interconnections between separate locations within a semiconductor package, the mounting apparatus comprising:
a flexural structure that is configured to bend, wherein the transducer is mounted to the flexural structure;
at least one actuator attached to the flexural structure, the at least one actuator being configured and operative to bend the flexural structure, thereby causing a displacement of the transducer on at least the horizontal plane; and a plurality of connectors configured to connect the mounting apparatus to the transducer, the mounting apparatus extending between an end of the transducer and the bond head.

4. The wire bonder of claim 3, wherein the ultrasonic transducer is configured to oscillate along its longitudinal axis and the at least one actuator of the mounting apparatus is operative to bend the flexural structure, such that the ultrasonic transducer is displaced along a path that is different from the longitudinal axis along which the ultrasonic transducer is operative to oscillate when mechanically driven by the bond head of the wire bonder.

5. The wire bonder of claim 4, wherein the mounting apparatus comprises two actuators attached to different points on the flexural structure.

6. The wire bonder of claim 5, wherein the two actuators of the mounting apparatus are configured to be actuated out of phase with respect to each other.

7. The wire bonder of claim 5, wherein the two actuators of the mounting apparatus are configured to be actuated in linear motions in opposite directions with respect to each other.

8. The wire bonder of claim 4, wherein the mounting apparatus comprises at least three actuators attached to the flexural structure, the at least three actuators being actuatable to bend the flexural structure such that the ultrasonic transducer is displaced along a plurality of paths each of which is different from the longitudinal axis along which the ultrasonic transducer is operative to oscillate when mechanically driven by the bond head of the wire bonder.

9. The wire bonder of claim 8, wherein the mounting apparatus comprises three actuators, two of the actuators being arranged on a plane and the third actuator being arranged outside the plane.

10. The wire bonder of claim 9, wherein the two of the actuators arranged on the plane are configured to be actuated out of phase with respect to each other.

11. The wire bonder of claim 9, wherein the two of the actuators arranged on the plane are configured to be actuated in linear motion in opposite directions with respect to each other.

12. The wire bonder of claim 9, wherein the two of the actuators arranged on the plane are configured to be actuated in phase with respect to each other, but the third actuator arranged outside the plane is configured to be actuated out of phase with respect to the two actuators arranged on the plane.

13. The wire bonder of claim 9, wherein the third actuator arranged outside the plane is configured to be actuated in linear motion in opposite directions to the two of the actuators arranged on the plane.

14. The wire bonder of claim 8, wherein the mounting apparatus comprises four actuators, two of the actuators being arranged on a first plane and the other two actuators being arranged on a second plane orthogonal to the first plane.

15. The wire bonder of claim 3, wherein the at least one actuator of the mounting apparatus is configured and operative to bend the flexural structure, such that the ultrasonic transducer is displaced along a path that corresponds to the longitudinal axis along which the ultrasonic transducer is operative to oscillate when mechanically driven by the bond head of the wire bonder.

16. The wire bonder of claim 3, wherein the at least one actuator of the mounting apparatus is a piezo-stack actuator configured and operative to be actuated by an electrical source operative at a sub-ultrasonic frequency.

17. The wire bonder of claim 3, wherein the at least one actuator of the mounting apparatus is a magnetostrictive actuator configured and operative to be actuated by an applied magnetic field.

\* \* \* \* \*